United States Patent [19]
Hopson et al.

[11] Patent Number: 5,975,757
[45] Date of Patent: Nov. 2, 1999

[54] METHOD AND APPARATUS FOR PROVIDING SURFACE IMAGES

[75] Inventors: Theresa J. Hopson, Mesa; Ronald N. Legge, Scottsdale, both of Ariz.

[73] Assignee: Motorola, Inc., Schaumburg, Ill.

[21] Appl. No.: 09/055,121

[22] Filed: Apr. 3, 1998

Related U.S. Application Data

[62] Division of application No. 08/560,600, Nov. 20, 1995, Pat. No. 5,772,325.

[51] Int. Cl.$^6$ .............................. G01K 7/04; G01K 3/06; G01B 9/04
[52] U.S. Cl. ..................... 374/142; 374/137; 374/179; 136/225; 136/233; 136/241; 356/376; 73/105
[58] Field of Search ..................................... 374/142, 137, 374/179; 136/225, 233, 241; 356/376; 73/105

[56] References Cited

U.S. PATENT DOCUMENTS

| | | |
|---|---|---|
| 2,473,627 | 6/1949 | Wickizer et al. . |
| 2,757,220 | 7/1956 | Carter . |
| 3,070,645 | 12/1962 | Tracht . |
| 3,386,861 | 6/1968 | Stroik . |
| 4,444,991 | 4/1984 | Beale . |
| 4,484,018 | 11/1984 | McLynn . |
| 4,969,956 | 11/1990 | Kreider et al. . |
| 5,121,994 | 6/1992 | Molitoris . |
| 5,356,218 | 10/1994 | Hopson et al. . |
| 5,383,354 | 1/1995 | Doris et al. . |
| 5,388,323 | 2/1995 | Hopson et al. . |
| 5,441,343 | 8/1995 | Pylkki et al. . |

FOREIGN PATENT DOCUMENTS

| | | |
|---|---|---|
| 0507835 | 2/1956 | Italy . |
| 1264010 | 10/1986 | U.S.S.R. . |
| 1413445 | 7/1988 | U.S.S.R. . |
| 2204732 | 11/1988 | United Kingdom . |

OTHER PUBLICATIONS

"Simultaneous High Resolution Topographical and Thermal Imaging Using a Diamond Tipped Thermocouple," by Hopson et al., Applied Physics Communications, 13, 1994, pp. 197–204.

A. Majumdar et al., "Thermal Imaging Using the Atomic Force Microscope" Appl. Phys. Letter., vol. 62, No. 20, May 17, 1993, pp. 2501–2503.

C. Williams et al., "Scanning Thermal Profiler", Appl. Phys. Letter., vol. 49, No. 23, Dec. 8, 1986, 1993, pp. 1587–1589.

*Primary Examiner*—Diego Gutierrez
*Assistant Examiner*—Quyen Doan
*Attorney, Agent, or Firm*—William E. Koch; Daniel R. Collopy

[57] ABSTRACT

An apparatus and method for providing a topographical and thermal image of a semiconductor device. A probe (10) is made from a first ribbon of material (11) and a second ribbon of material (12) which forms a thermocouple junction (13). A probe tip (15) is then attached to the thermocouple junction (13) with an epoxy (14). In an alternate embodiment of the present invention, a probe (20) has a point region (17) which is formed by bending a portion of the thermocouple junction (13) and coating the point region (17) is coated with a thermally conductive material. An optical signal is then reflected off a planar portion of the first ribbon of material (11), the second ribbon of material (12), or the thermocouple junction (13) so the motion of the probe (10,20) can be monitored by an optical detector.

6 Claims, 1 Drawing Sheet

METHOD AND APPARATUS FOR PROVIDING SURFACE IMAGES

The present application is a division of U.S. application No. 08/560,600 filed on Nov. 20, 1995, now U.S. Pat. No. 5,772,325 which is hereby incorporated by reference, and priority thereto for common subject matter is hereby claimed.

BACKGROUND OF THE INVENTION

This invention relates, in general, to surface imaging probes, and more particularly, to probes that provide atomic force microscopy images and methods for forming such probes.

To investigate the failure modes of semiconductor devices, it is very advantageous to be able to generate images of the surface of the semiconductor device. Such images have been traditionally formed using atomic force microscopy (AFM). A probe tip is dragged across the surface of the semiconductor device and the topography of the surface is measured by an optical signal which is reflected off of a mirror affixed to the probe. Movement of the probe will result is a corresponding motion in the mirror. To mount the mirror, an insulating epoxy or an insulating layer is used to electrically isolate the mirror from the AFM probe. Due to the thermal conditions of operation, this insulation can breakdown with time and cause the probe to fail. An additional problem with the mirror is that they are typically mounted to the probe at a significant distance away from the probe tip. As a result, the motion of the mirror does not necessarily replicate the motion of the probe, and there is a loss of accuracy in the measuring of the topography of the surface.

In addition to the AFM, a thermal image of the device's surface is very valuable in identifying hot spots. To produce a thermal image, a previously known method forms the AFM probe from a thermocouple which measures the temperature of the surface as the probe is moved. However a disadvantage is that the thermal energy of the semiconductor device is transferred to the reflective mirror which can create noise in both the topographical image and the thermal profile of the semiconductor device.

By now, it should be appreciated that it would be advantageous to provide an improved method for forming an AFM/thermal image probe that does not require the use of a mirror mounted to the probe. It would of further advantage if the probe were easier to manufacture and more reliable than previously known imaging probes.

DETAILED DESCRIPTION OF THE DRAWINGS

Figure 1:
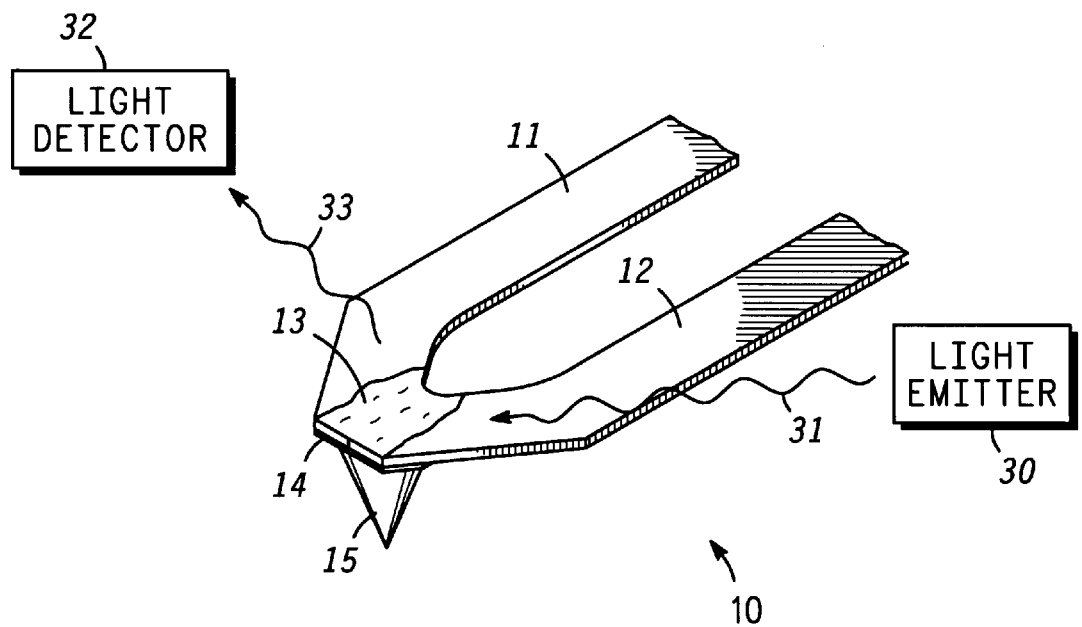
FIG. 1 is an enlarged isometric view showing a probe according to the present invention.

FIG. 1 is a enlarged isometric view showing an Atomic Force Microscope (AFM) probe or probe 10, capable of providing a surface image, according to the present invention. Probe 10 can be used in conjunction with an atomic force microscope such as a Digital Instruments Nanoscope III to generate both a thermal and topographical image of the surface of a semiconductor device. The Nanoscope III instrument is manufactured by Digital Instruments Inc., of Santa Barbara, California and method for its use with a probe is described in U.S. Pat. No. 5,388,323, which issued to Hopson et al. on Feb. 14, 1995 and is hereby incorporated by reference. The present invention offers an improvement in that the thermal and topographical image can be provided without the use of a mounted mirror as taught in some previously known probes.

Probe 10 comprises a thermocouple formed from a first ribbon of material 11 and a second ribbon of material 12. First ribbon of material 11 and second ribbon of material 12 can be formed from a variety of materials such as nickel-chrome alloy, nickel-rhodium alloy, platinum-rhodium alloy, platinum, iron, copper, copper-nickel alloy, and tungsten-rhenium alloy. For example, first ribbon of material 11 and second ribbon of material 12 can be formed from "Chromel" and "Alumel," which are trademarks of Hoskins Manufacturing Co. of Detroit, Mich. "Chromel" is an alloy having approximately 90% nickel and 10% chromium. "Alumel" is an alloy of approximately 95% nickel, 2.5% manganese, and 2.5% aluminum. Preferably, first ribbon of material 11 and second ribbon of material 12 are formed to have a width of 25 microns to 500 microns and a thickness of about 25 microns to about 500 microns.

To form thermocouple junction 13, a portion of first ribbon of material 11 and second ribbon of material 12 are placed in contact with each other and welded together. In order to form thermocouple junction 13, first ribbon of material 11 and second ribbon of material 12 are materials with different composition. One method for forming thermocouple junction 13, for example, is by applying electric current through the overlapping portions of first ribbon of material 11 and second ribbon of material 12. A probe tip 15 is then attached to probe 10 using an epoxy 14. Probe tip 15 is formed from an electrically insulating and thermally conductive material such as diamond, carbon, or silicon nitride. Probe tip 15 is attached to probe 10 such that at least a portion of probe tip 15 is in contact with thermocouple junction 13. This allows probe tip 15 to provide data on both the surface temperature and surface topography of a semiconductor device.

A significant advantage of the present invention is that probe 10 is formed with thin ribbons of material 11 and 12, rather than circular wires as shown in some previously known probes. Since first ribbon of material 11, second ribbon of material 12, and the top of thermocouple junction 13 have a reflective planar surface, the need for an additional reflective mirror is obviated. In order to detect the motion of probe 10, the present invention uses a light emitter 30 to direct a light source 31 directly onto either first ribbon of material 11, second ribbon of material 12, or thermocouple junction 13. As probe tip 15 follows the surface topography of a semiconductor device, the motion is detected by a light detector 32 which monitors the optical signal 33 coming off the reflective surface of either first ribbon of material 11, second ribbon of material 12, or thermocouple junction 13. It should be understood that only a portion of first ribbon of material 11 and second ribbon of material 12 need to have a flat and reflective surface. It is also possible that first ribbon of material 11 and second ribbon of material 12 are formed from round or oddly shaped wires that have a flat surface to reflect light from a light emitter.

Since probe 10 does not require the use of a mirror, there is no risk of shorting first ribbon of material 11 to second ribbon of material 12. The motion of probe tip 15 can be measured directly above or in close proximity to probe tip 15 which will improve the accuracy of the image relative to a system that measures the motion from a mirror which is placed away from the probe tip. The removal of the mirror will also reduce noise and further improve the accuracy of the image generated. Further, since a mirror is no longer required, the total manufacturing cost is reduced and the manufacturing procedure is simplified.

Figure 2:
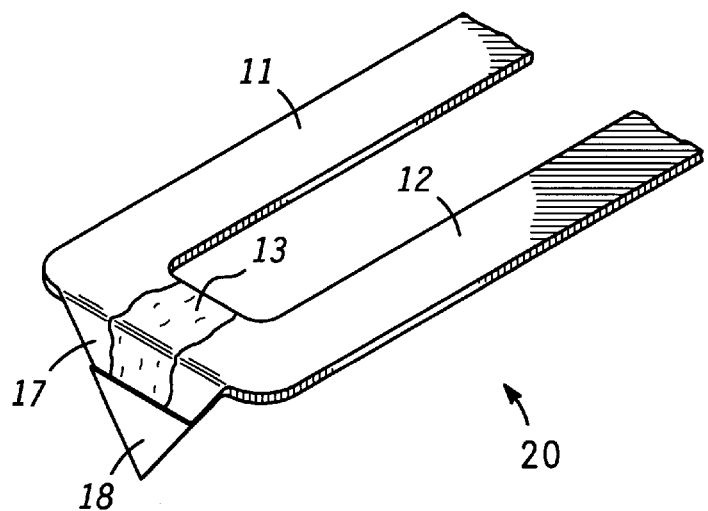
FIG. 2 is an enlarged isometric view of a probe according to an alternate embodiment of the present invention.

An alternate embodiment of the present invention will now be provided. FIG. 2 is an enlarged isometric view of a probe 20 according to this alternate embodiment. Instead of mounting a probe tip 15 onto probe 10, a portion of thermocouple junction 13 is bent to form a point region 17. Point region 17 is coated with a thermally conductive material such as diamond, carbon, or silicon nitride to form a coated region 18. Coated region 18 is used to provide topographical measurements of the surface of a semiconductor device. Since coated region 18 is thermally conductive, it can also be used to provide a thermal path to thermocouple junction 13, allowing thermal measurement of the surface of a semiconductor device.

As described above, point region 17 is formed by bending only a portion of thermocouple junction 13. It should also be understood, that point region 17 can also be formed by bending a portion of first ribbon of material 11 and second ribbon of material 12 as well as thermocouple junction 13. The flat surfaces of first ribbon of material 11, second ribbon of material 12, or thermocouple junction 13 can be used to reflect an optical signal from an laser emitter to an optical detector to determine the surface profile of a semiconductor device. In this alternate embodiment, coated region 18 has less mass than probe tip 15 of the previous embodiment. As a result, probe 20 will have an improved thermal response to changes in the surface temperature of the semiconductor device.

By now it should be appreciated that the present invention provides improved methods for forming a probe capable of generating a thermal and topographical image of the surface of a semiconductor device. Since flat ribbons of themocoupling material are used, the need for an additional mirror is obviated. The probes of the present invention are easier to fabricate and require fewer elements, which will reduce the final manufacturing cost. Since a mirror, and the complications associated with attaching a mirror to the probe, are eliminated, the present invention has improved accuracy in its topographical sensitivity and improved operational reliability.

We claim:

1. A method for generating a surface image of a semiconductor device comprising the steps of:

providing a probe including a first ribbon of material, wherein at least a portion of the first ribbon of material provides a reflective planar surface, a second ribbon of material forming a thermocouple junction with the first ribbon of material, and a probe tip underlying at least a portion of the thermocouple junction;

moving the probe tip across the surface of the semiconductor device;

reflecting an optical signal off the planar surface as the probe tip is moved; and analyzing the optical signal reflected off the planar surface to determine the surface image.

2. The method of claim 1 wherein the step of reflecting an optical signal includes the steps of:

generating the optical signal with a light generator, wherein the optical signal is directed towards the probe tip; and detecting the optical signal with a light detector after the optical signal has been directed towards the probe tip.

3. The method of claim 1 wherein the step of generating the optical signal includes directing the optical signal towards the thermocouple junction of the probe.

4. An apparatus for providing a surface image comprising:
a light detector for detecting an optical signal; and
a probe comprising:
a first ribbon of material, wherein at least a portion of the first ribbon of material provides a planar surface and the planar surface is reflective and coupled to the light detector;
a second ribbon of material forming a thermocouple junction with the first ribbon of material; and
a probe tip underlying at least a portion of the thermocouple junction; and
a light emitter that provides the optical signal, wherein the optical signal is reflected off the planar surface, the optical signal then being analyzed to determine movement of the probe.

5. The apparatus for providing a surface image of claim 4 wherein the probe tip is formed from a thermally conductive and electrically insulating material.

6. The apparatus for providing a surface image of claim 4 wherein the first ribbon of material and the second ribbon of material have a width of about 25 microns to 500 microns and a thickness of about 25 microns to 500 microns.

* * * * *